United States Patent [19]

Tanaka

[11] Patent Number: 5,238,870
[45] Date of Patent: Aug. 24, 1993

[54] EXPOSURE PROCESS FOR WRITING A PATTERN ON AN OBJECT

[75] Inventor: Hiroyuki Tanaka, Kanagawa, Japan
[73] Assignee: Fujitsu Limited, Kawasaki, Japan
[21] Appl. No.: 806,402
[22] Filed: Dec. 13, 1991

[30] Foreign Application Priority Data

Dec. 14, 1990 [JP] Japan ................................. 2-402367

[51] Int. Cl.⁵ .......................................... H01L 21/268
[52] U.S. Cl. ........................................ 437/173; 437/7; 437/924; 437/935; 437/948
[58] Field of Search ............. 437/7, 9, 173, 924, 437/935, 936, 948; 148/DIG. 93, DIG. 102, DIG. 104

[56] References Cited

U.S. PATENT DOCUMENTS

| | | | |
|---|---|---|---|
| 4,200,395 | 4/1980 | Smith et al. | 437/7 |
| 4,232,969 | 11/1980 | Wilczynski | 437/7 |
| 4,377,028 | 3/1983 | Imahashi | 437/173 |
| 4,414,749 | 11/1983 | Johannsmeier | 437/924 |

FOREIGN PATENT DOCUMENTS

| | | |
|---|---|---|
| 61-184829 | 8/1986 | Japan . |
| 61-232615 | 10/1986 | Japan . |
| 61-232616 | 10/1986 | Japan . |
| 0058626 | 3/1987 | Japan ................................. 437/924 |
| 63-12134 | 1/1988 | Japan . |
| 2131167 | 6/1984 | United Kingdom ................ 437/924 |

OTHER PUBLICATIONS

"The Optical Stepper with a High Numerical Aperture i-line Lens and a Field-by-Field Leveling System", SUWA et al, SPIE vol. 922 Optical/Laser Microlithography (1988), pp. 270–276.

Primary Examiner—Brian E. Hearn
Assistant Examiner—C. Chaudhari
Attorney, Agent, or Firm—Nikaido, Marmelstein, Murray & Oram

[57] ABSTRACT

A method for exposing a surface of an object to a radiation beam for writing a pattern thereon. The method includes the steps of producing a radiation, shaping the radiation to form a shaped radiation beam such that the shaped radiation beam has an elongated cross section extending in a first direction, directing the shaped radiation beam to a reticle that carries a transparent pattern and an opaque pattern for patterning the shaped radiation beam to form a patterned beam in accordance with the transparent and opaque patterns upon passage through the reticle and for illuminating the surface of the object by the patterned beam, and maintaining a focusing of the patterned beam on the surface of the object by moving said object, wherein the step of directing the patterned beam includes a step for scanning the patterned beam in a second, different direction over a surface of the reticle.

15 Claims, 15 Drawing Sheets

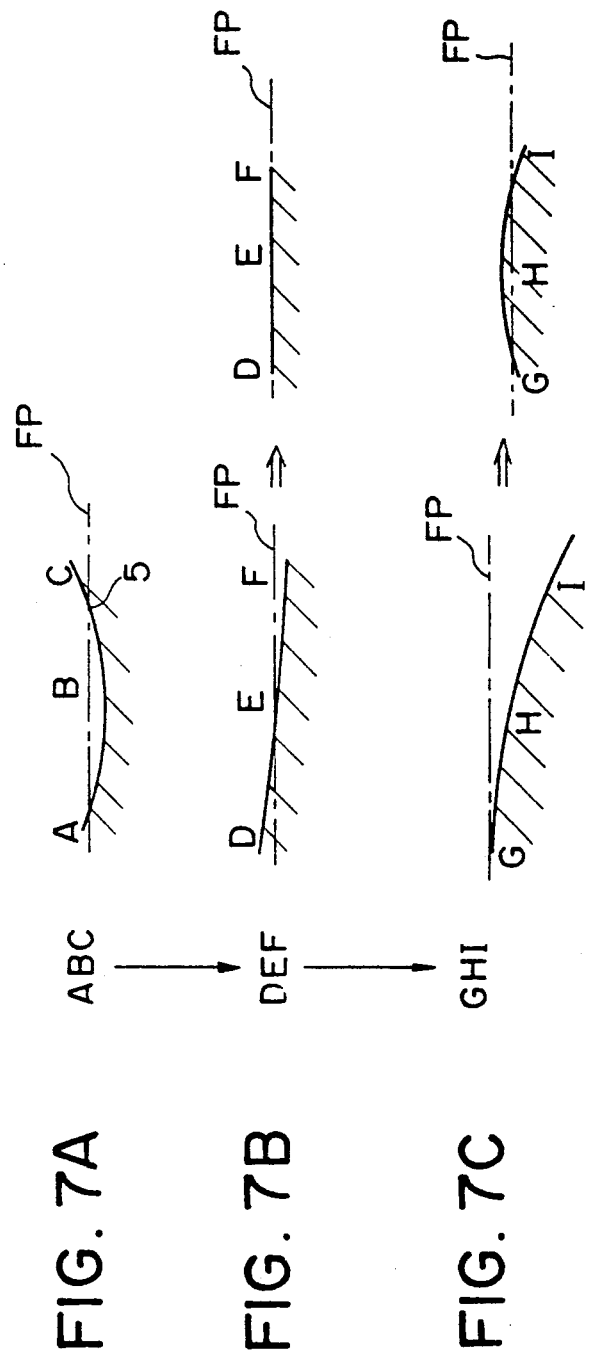

FIG.IIA
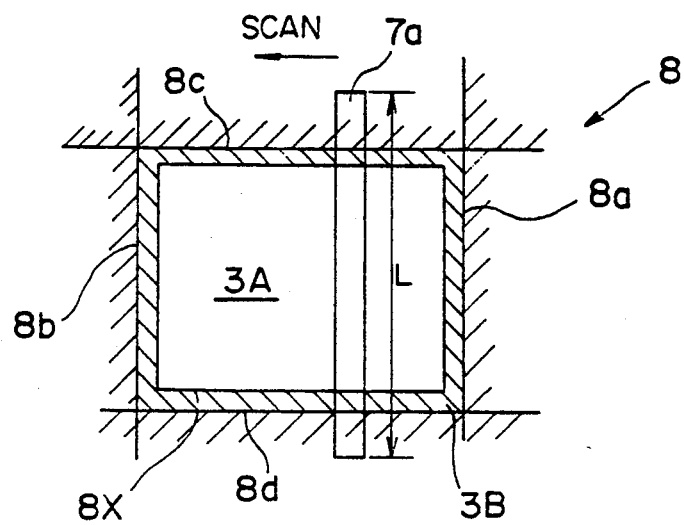
FIG.IIB
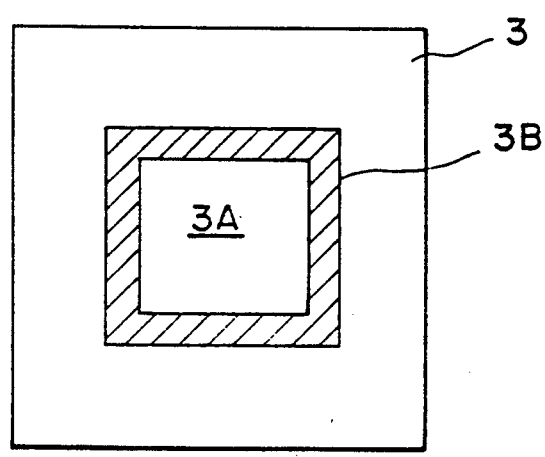

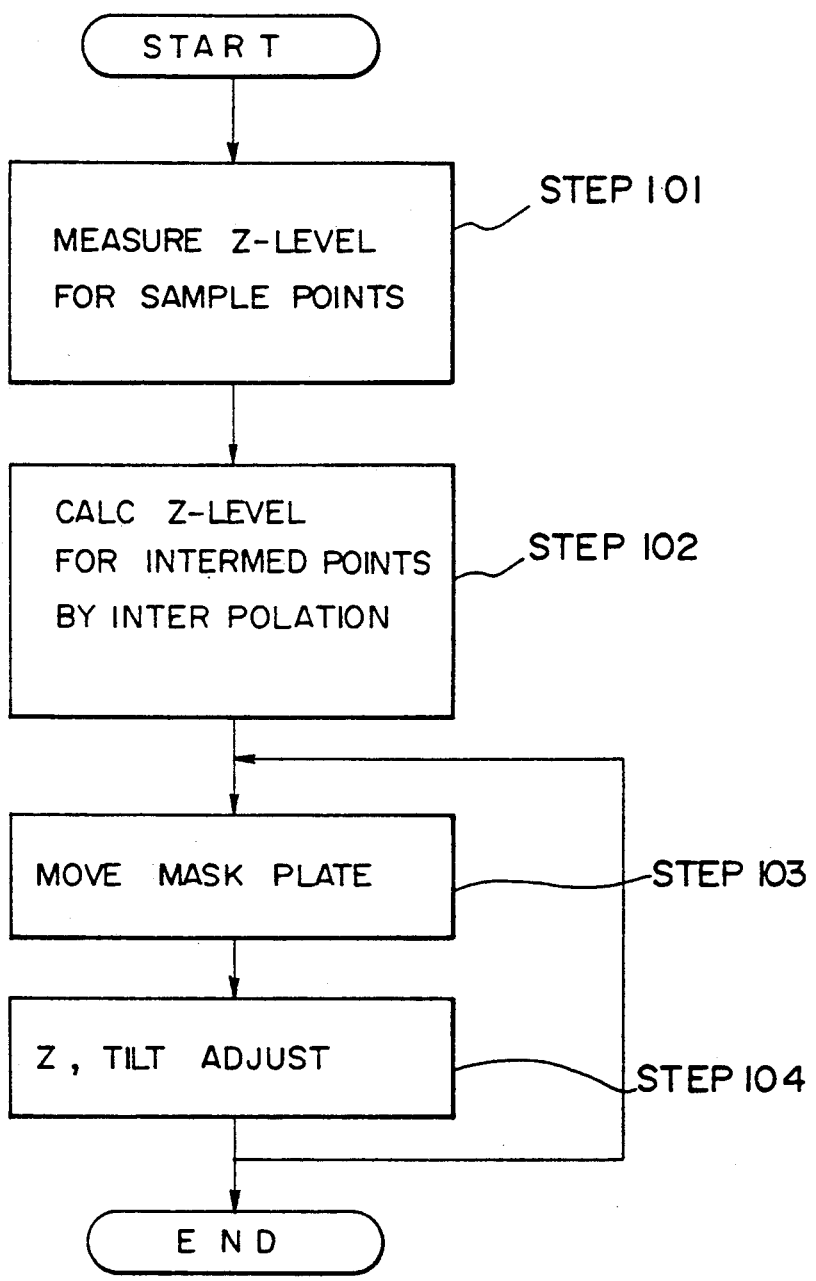

EXPOSURE PROCESS FOR WRITING A PATTERN ON AN OBJECT

FIELD OF THE INVENTION

The present invention generally relates to fabrication of semiconductor devices and more particularly to a process for writing a pattern of an integrated circuit on a substrate by means of an optical beam.

BACKGROUND OF THE INVENTION

In the fabrication of large-scale integrated circuits (LSIs), very fine semiconductor patterns are exposed on a semiconductor substrate. With increasing integration density, the problem of resolution that can be achieved by the optical system used for the exposure is becoming a serious problem.

The desired improvement of the resolution can be achieved when a radiation having a smaller wavelength is employed. Thus, there is an intensive study conducted on the electron beam exposure systems or X-ray exposure systems. In the X-ray exposure systems, there is a problem of relatively low throughput because of the essential nature of this process that the semiconductor pattern has to be written on the substrate in one stroke. In the X-ray exposure systems, on the other hand, there is a problem of constructing a radiation source that has a sufficient output power. Further, there are various problems to be solved, and these exposure processes are not yet used for the mass production of integrated circuits.

In order to achieve the high throughput, it is desirable to use the optical exposure process called aligner wherein an optical radiation such as ultraviolet light is used for the exposure. It should be noted that, in the optical exposure system that has a limitation in the wavelength of the radiation, the resolution of an optical system can be increased by increasing the numerical aperture. On the other hand, it is well known that such an increase in the numerical aperture inevitably invites a decrease in the focal depth. In other words, one has to focus closely the optical beam on the surface of the semiconductor substrate.

Generally, the surface of the semiconductor substrate or wafer is not completely flat but certain deviation from the ideal flatness cannot be avoided. In the usual step-and-repeat process, a region having a size of about 20 mm×20 mm is exposed at a time while moving the wafer stepwise in the lateral direction. In such an area of the semiconductor substrate, a surface undulation typically of the magnitude of 0.7–0.8 $\mu$m exists.

FIG. 1 shows the example of the surface undulation of the semiconductor substrate. It should be noted that the surface of the semiconductor substrate represented by a line 100 is undulated with a magnitude $\Delta$ that is typically of about 0.7–0.8 $\mu$m for the unit exposure region designated as EXPOSURE REGION. As already noted, the region typically has the size of about 20 mm×20 mm. On the other hand, the image of the semiconductor pattern is formed on a plane represented by f1. In the conventional low-resolution exposure process, such a magnitude of the surface undulation has been within the focal depth of the optical system and the exposure for the entire region could be made without problem. On the other hand, when the submicron patterning process is applied with the optical system having an increased numerical aperture, the focusing control with deviation much smaller than the foregoing magnitude of undulation has to be observed for achieving proper focusing of the semiconductor image on the substrate. Otherwise, the image on the substrate would be blurred.

In order to eliminate the foregoing problem, Japanese Laid-open Patent Application 63-12134 as well as Japanese Laid-open Patent Applications 61-184829, 61-232615 and 61-232616 describe an optical exposure system, wherein the optical radiation produced by an optical source is shaped to form a narrow optical beam that illuminates a limited area of the exposure region shown in FIG. 1, and the narrow optical beam thus formed is scanned over the exposure region while maintaining the focusing of the optical beam on the surface of the semiconductor substrate. In order to form the narrow optical beam, an aperture plate is used. The scanning of the optical beam is caused either by deflecting the optical beam by tilting a mirror that deflects the optical beam to the substrate or by moving the mirror in the direction parallel to the surface of the substrate.

According to the conventional approach disclosed therein, a close focusing of the optical beam is certainly achieved. However, associated with the deflection caused by the tilting of the mirror, the optical beam enters into a demagnifying optical system with a path oblique to the optical axis and there occurs the problem of aberration. When the scanning is achieved by moving the mirror parallel, on the other hand, the effective optical length is changed and one needs additional complex optical system to maintain the focusing of the optical beam on the substrate.

SUMMARY OF THE INVENTION

Accordingly, it is a general object of the present invention to provide a novel and useful process for exposing a pattern on an object, wherein the foregoing problems are eliminated.

Another and more specific object of the present invention is to provide a process for exposing a semiconductor pattern on a substrate that has an undulated surface by an optical beam while maintaining a close focusing control of the optical beam.

Another object of the present invention is to provide a process for exposing a semiconductor pattern on a substrate having an undulated surface by shaping the optical beam into an elongated beam having a substantially one-dimensional cross-section, illuminating a semiconductor substrate by the elongated beam through a reticle that carries the semiconductor pattern while moving the elongated beam over the reticle in a direction substantially perpendicular to the elongated direction of the beam cross section, and controlling the vertical position as well as the tilt angle of the semiconductor substrate simultaneously to the movement of the elongated beam on the reticle such that a proper focusing of the beam on the substrate is maintained. According to the present invention, it is possible to maintain the close focusing control of the optical beam on the substrate. Thereby, the resolution of the semiconductor pattern exposed on the substrate is substantially improved by the use of optical systems that have a large numerical aperture.

Other objects and further features of the present invention will become apparent from the following detailed description when read in conjunction with the attached drawings.

BRIEF DESCRIPTION OF THE DRAWINGS

FIGS. 7(A)–7(C) are diagrams showing the focusing control achieved for various part of FIG. 6;

FIGS. 11(A) and 11(B) are diagrams showing the relationship between the scanning direction of the beam shaping slit used in the present invention, a reticle blind used in the exposure system and the semiconductor pattern on the reticle;

FIG. 15 is a flowchart showing the operation of the optical exposure system according to the present invention.

DETAILED DESCRIPTION OF THE PREFERRED EMBODIMENTS

Figure 1:
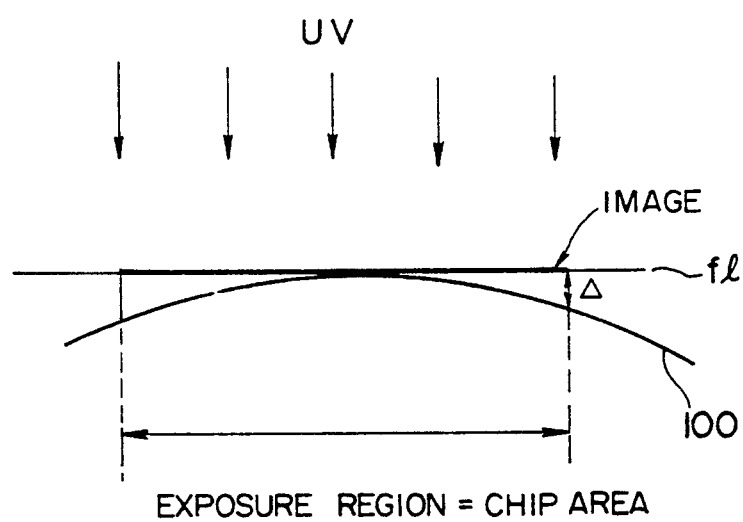
FIG. 1 is a diagram for explaining the problem of conventional exposure process.
Figure 2:
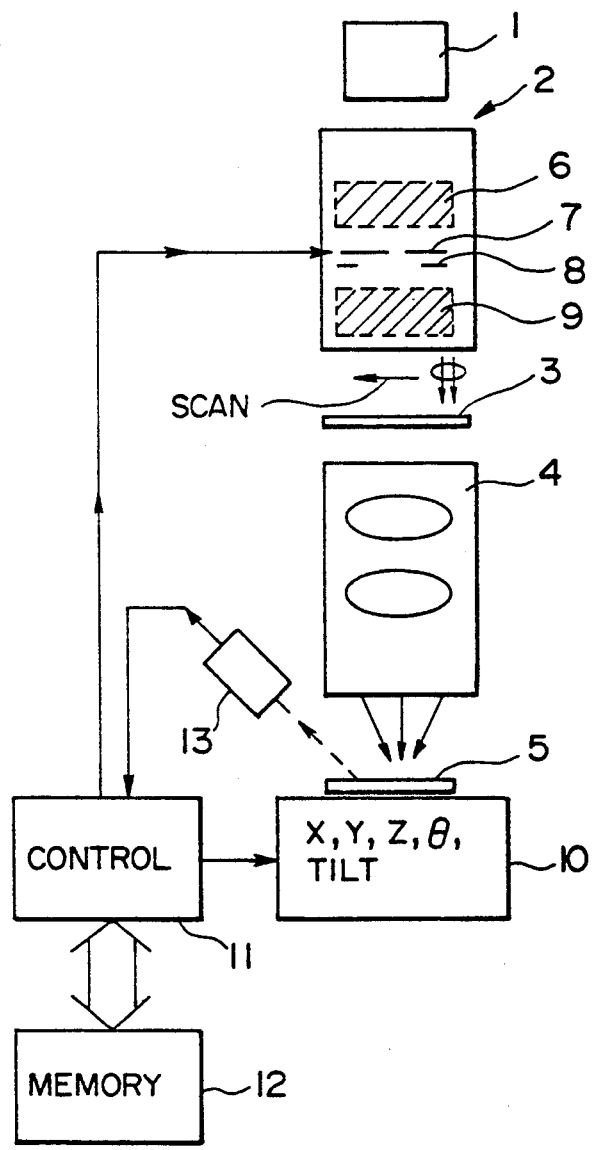
FIG. 2 is a diagram showing the construction of an optical exposure system that is used for carrying out the exposure process of the present invention.

FIG. 2 shows the aligner or optical exposure system used in the present invention for executing the optical exposure of integrated circuit pattern on a semiconductor substrate or wafer.

Referring to the drawing, the exposure system includes an optical source 1 that may be a mercury lamp or excimer laser. The optical source 1 produces optical radiation that is directed to a reticle mask 3 in the form of an optical beam after passing through an illuminating system 2. The illuminating system 2 forms the optical beam from the optical radiation as usual. The reticle mask 3 carries thereon the pattern of integrated circuit.

The illuminating system 2 includes first and second lens systems 6 and 9 and forms a parallel optical beam based upon the optical radiation produced by the optical source 1. Further, as will be described later in detail, the illuminating system 2 includes a movable mask plate 7 immediately above a reticle blind 8 that is used to define a region of the pattern on the reticle that is to be illuminated by the optical beam. Generally, the region defined by the reticle blind 8 corresponds to the pattern for one chip. The mask plate 7 carries thereon a beam shaping slit and shapes the optical radiation into the optical beam having an elongated cross section. The optical beam thus produced is then directed to the reticle mask 3.

As will be described in detail later, the elongated optical beam sweeps the surface of the reticle 3 in response to the movement of the mask plate 7 that is moved in the direction generally perpendicular to the elongating direction of the optical beam. Thereby, the direction of movement of the optical beam is set in the direction generally perpendicular to the elongating direction of the optical beam cross section. In other words, the elongated region of the reticle 3 that is illuminated by the optical beam moving over the surface of the reticle 3 in response to the movement of the mask plate 7.

The optical beam thus passed through the reticle 3 then enters into a usual demagnification optical system 4 including a number of lenses and focused on a wafer 5 that is held on a movable stage 10. The stage 10 is movable in the three mutually perpendicular directions X, Y and Z wherein the direction Z is set generally coincident with the direction of the optical axis of the aligner. Thereby, the X-Y plane is defined perpendicular to the optical axis. In addition, the stage 10 is formed movable to rotate about the Z-direction and further to tilt with respect to the X-Y plane defined above.

In order to control the movement of the stage 10, there is provided a controller 11 that cooperates with a memory 12. Further, there is provided a focusing detector 13 that detects the focusing of the optical beam on the surface of the wafer 5. In operation, an optical beam having a wavelength that is different from the wavelength used for the exposure is irradiated on the surface of the wafer 5 via the illuminating system 2 while moving the wafer 5 in the X-Y plane by the stage 10. There, the level of the wafer surface in the Z-direction is detected for various sampling points as will be described later with reference to FIGS. 8(A)–8(D). The values for the surface level thus obtained are stored in the memory 12 for each set of the coordinate in the X-Y plane.

In the system of FIG. 2, the exposure is achieved for each chip region by scanning the reticle 3 by the shaped optical beam while controlling the stage 10 simultaneously in the Z-direction and further tilting in accordance with the data stored in the memory 12. As the exposure is achieved for the strip-like narrow region on the wafer 5, it is possible to maintain a close focusing for such a narrow region. By sweeping the optical beam over the reticle 3, the strip-like region moves over the wafer 5 while maintaining the focusing and a fine semiconductor pattern can be exposed on the wafer 5 with a high resolution. The exposure process outlined above is particularly useful for an exposure system that uses an optical system of large numerical aperture where the focal depth is very small.

Figure 3:
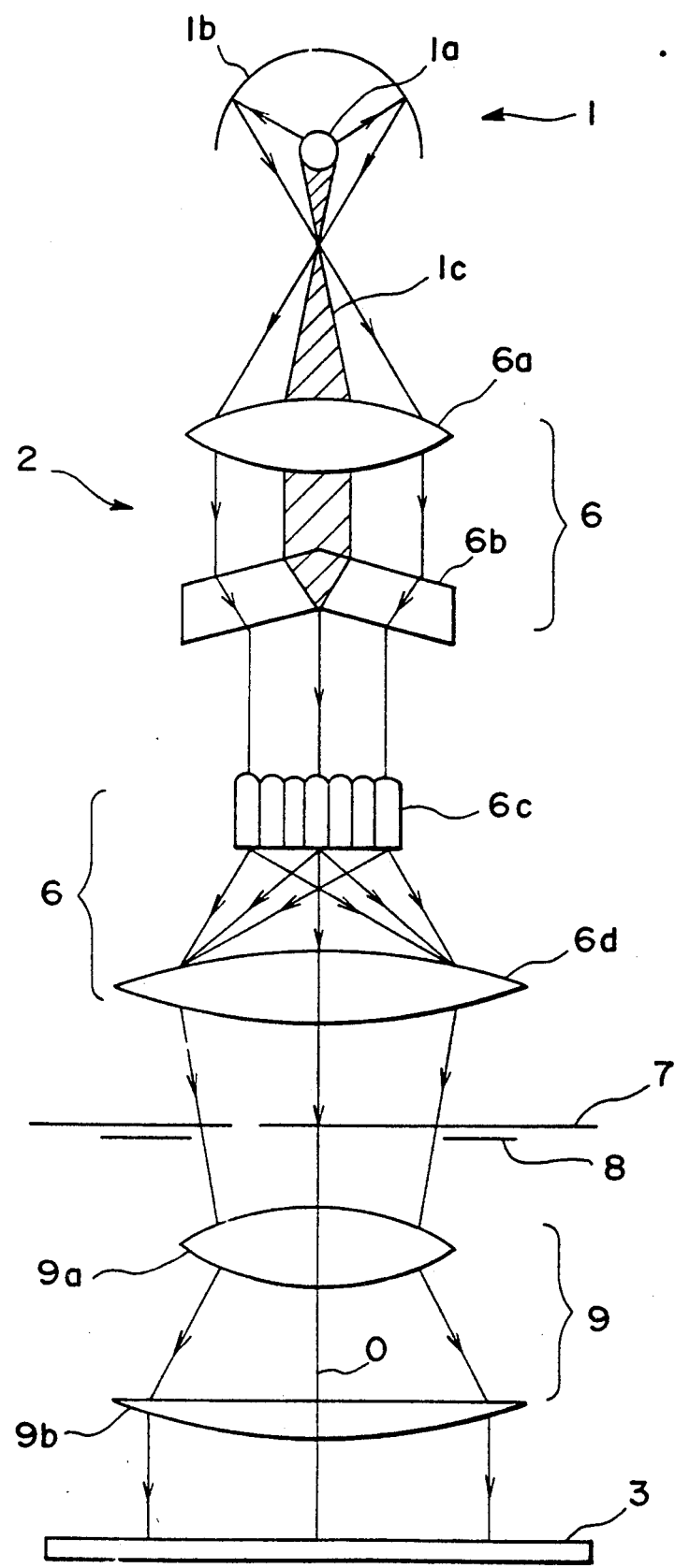
FIG. 3 is a diagram showing a part of the exposure system of FIG. 2 in detail.

FIG. 3 shows the details of the optical source 1 and the illuminating system 2 used in the exposure system of FIG. 2.

Referring to FIG. 3, the optical source 1 includes a mercury lamp 1a and a reflector 1b, wherein the reflector 1b forms an ellipsoid and the lamp 1a is located at a first focus of the ellipsoid.

The optical radiation thus formed by the optical source 1 enters to the optical system 6 that includes a lens 6a for producing a parallel optical beam and a lens 6b. It will be noted that there is formed a shadow 1c in the optical radiation formed by the electrode of the optical source, and the lens 6b is used to eliminate the shadow 1c.

After passing through the lens 6b, the optical beam is deflected to the optical axis and the shadow zone 1c is eliminated. In FIG. 3, the optical axis is represented as an optical path O. The optical beam exits from the lens 6a as a parallel beam and enters to a fly-eye lens 6c that is formed from a number of lenses arranged in parallel. Thereby, the incident optical beam is split into a number of rays corresponding to the lenses of the fly-eye lens 6c and enter to a second lens 6d. The lenses 6c and 6d also form a part of the lens system 6. After passing through the lens 6d, the optical beam enters the lens system 9 that includes lenses 9a and 9b, and illuminates the reticle 3. Upon passage through the reticle 3, the optical beam is shaped in accordance with the semiconductor pattern formed on the reticle 3, and focused on the surface of the semiconductor wafer 5 after passing through the demagnification lens system 4 as usual. Further, in order to define the region of the reticle 3 that is illuminated by the optical beam, the reticle blind 8 is used as usual.

In the optical exposure system used in the present invention, there is provided a mask plate 7 that has a beam shaping slit 7a for interrupting the optical beam except for the slit 7a. The mask plate 7 is preferably provided at a position on the optical axis substantially conjugate to the reticle 3. In the illustrated example, the mask plate 7 is located between the lens 6d of the lens system 6 and the lens 9a of the lens system. Thereby, a shaped beam having an elongated cross section corresponding to the slit 7a is formed and the shaped beam thus formed illuminates the reticle 3 with a corresponding elongated pattern. In other words, only a part of the reticle pattern that is illuminated by the elongated optical beam is exposed on the surface of the wafer 5 at a time. By moving the mask plate 7 in a direction shown by the arrow in FIG. 3, the elongated region of illumination on the reticle 3 moves over the surface of the reticle and the semiconductor pattern on the reticle 3 is scanned. As a result of the sweep of the entire reticle pattern by the optical beam, the semiconductor pattern on the reticle is transferred to the wafer 5.

It should be noted that the reticle blind 8 is provided at the position conjugate to the reticle 3 on the optical axis passing through the illuminating system 2. Thus, the mask plate 7 is provided close to the reticle blind 8. As the image of the slit 7a projected on the surface of the reticle 3 is not necessarily be very sharp, it is not necessary to provide the mask plate 7 exactly in coincidence to the optically conjugate position.

FIGS. 4(A)–4(E) are diagrams showing the sweep of the surface of the wafer 5 by the shaped optical beam. Referring to the drawings, the surface of the wafer 5 is curved or undulated as illustrated with a magnitude that exceeds the focal depth achieved by the optical system. As already noted, the focal depth of the high resolution optical exposure system is extremely small due to the large numerical aperture.

Figure 4A:
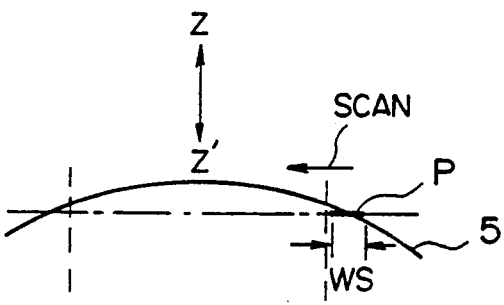
FIGS. 4(A)–4(E) are diagrams showing the exposure process according to a first embodiment of the present invention.

In FIG. 4(A), the strip-like elongated region that is exposed by the shaped optical beam is shown as a region P wherein FIG. 4(A) shows a cross section taken along a direction perpendicular to the direction of elongation. As already noted, the region P is exposed with an image corresponding to the elongated region of illumination of the reticle 3. It should be noted that the width of the region P, measured in the direction of the arrow of FIG. 4(A) and represented as WS, is set such that the magnitude of undulation of the surface of the wafer 5 falls within the range of focal depth of the optical system. In other words, the width WS of the region P is set such that a clear focusing of the image is achieved. In view of the commonly existing undulation in the magnitude of 0.7–0.8 $\mu$m for the area of 20 mm×20 mm, the width WS is typically set to 2–3 mm on the surface of the wafer 5.

Figure 4B:
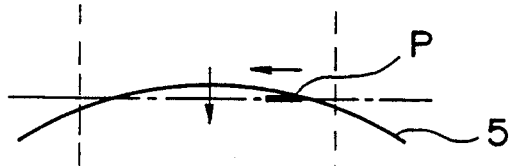

In FIG. 4(B), the mask 7 is moved such that the region P moves in the direction indicated by an arrow in response to the movement of the elongated region of illumination on the surface of the reticle 3. It should be noted that the movement of the mask 7 causes the scanning of the reticle 3 by the shaped optical beam of the elongated cross section. Simultaneously, the wafer 5 is lowered in the Z' direction that is opposite to the Z direction such that the proper focusing is maintained for the region P.

Figure 4C:
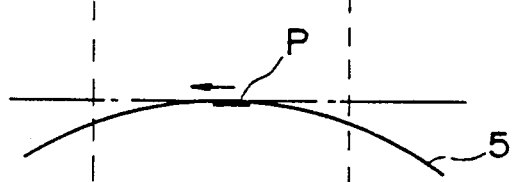

In FIG. 4(C), the mask 7 is moved further and the region P moves further in correspondence thereto. In the example shown in FIG. 4(C), the region P is located on the top of the undulation of the wafer 5.

Figure 4D:
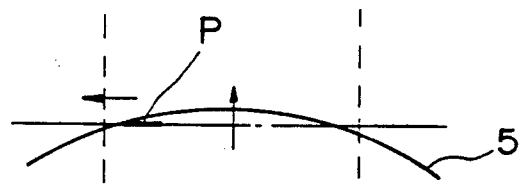
Figure 4E:
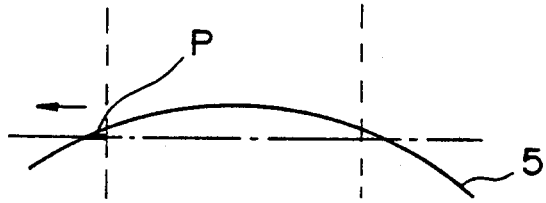

Next, in the step of FIG. 4(D), the wafer 5 is raised while moving the mask 7 and hence the shaped optical beam on the reticle 3 such that the desired proper focusing is maintained on the surface of the wafer 5. Further, the surface of the wafer 5 is entirely scanned in the step of FIG. 4(E) for the area corresponding to one semiconductor chip.

According to the process described above, it will be understood that a near-ideal focusing is achieved for the region P and the pattern on the reticle 3 corresponding to one full chip is transferred to the wafer 5 by moving the mask 7 in synchronization with the movement of the stage 10 in the Z-direction that coincides with the direction of the optical axis O. Thereby, the problem of focusing error pertinent to the optical exposure system of high resolution is eliminated.

Figure 5A:
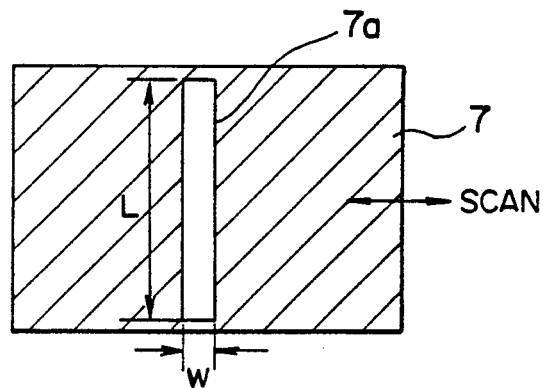
FIGS. 5(A)–5(F) are diagrams showing various beam shaping masks used in the system of FIG. 2.
Figure 5B:
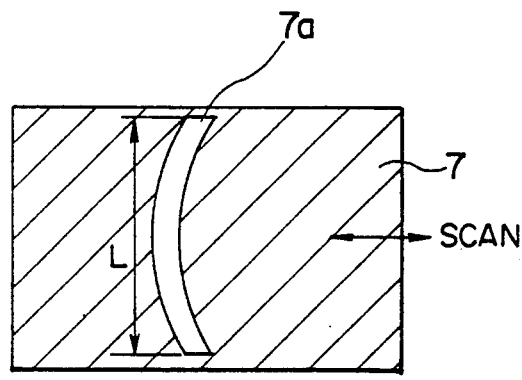
Figure 5C:
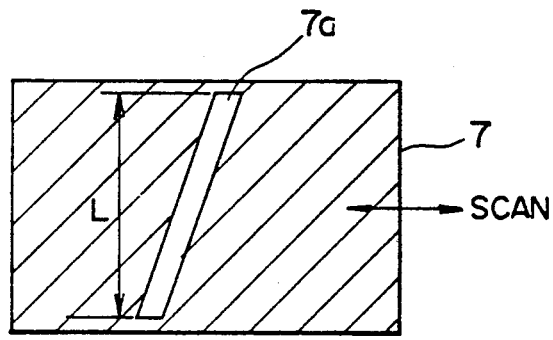

FIGS. 5(A)–5(F) show various beam shaping slits 7a formed on the mask plate 7, wherein FIG. 5(A) shows the most basic form of the slit 7a. In this example, the slit 7a has a simple rectangular form extending in the elongated direction with the width W that is uniform throughout the length of the slit 7a. The slit 7a extends for a length L that is determined to cover substantially the entire lateral size of the reticle pattern corresponding to one chip. However, the shape of the slit 7a is not limited to the rectangular form but may be curved as shown in FIG. 5(B) as long as the slit 7a extends generally in the direction perpendicular to the direction of scanning shown in the drawing by an arrow. In this example, too, the length L of the slit 7a is set to cover the full width of the reticle region for one chip. FIG. 5(C) shows another example wherein the slit 7a is formed obliquely to the scanning direction. Any of these embodiments can be applied to the exposure process of FIGS. 4(A)–4(E).

Figure 5D:
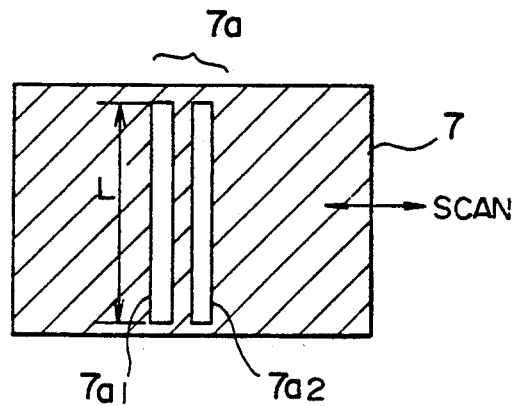

FIG. 5(D) shows another example of the slit 7a wherein the slit 7a is formed not from a single opening but from two separated slits $7a_1$ and $7a_2$ extending generally parallel with each other for the length L defined previously. Thereby, the reticle surface is swept twice by two elongated optical beams, one formed by the slit $7a_1$ and the other formed by the slit $7a_2$, when the mask plate 7 is moved as indicated by an arrow in the drawing. In correspondence to this, the surface of the wafer 5 is exposed twice. This embodiment is particularly advantageous for eliminating the excessive heating of the photoresist on the surface of the wafer 5 or for eliminating the thermal deformation of the lenses in the demagnification system 4.

Figure 5E:
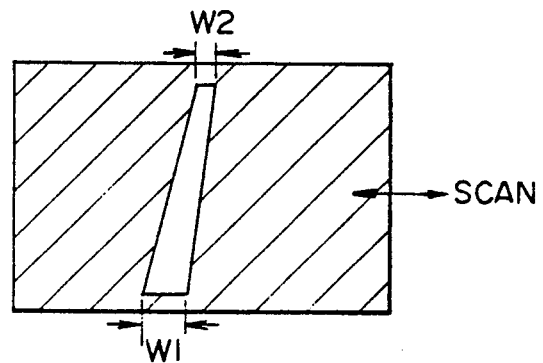

FIG. 5(E) shows an embodiment wherein the width of the slit 7a is set to a first size W1 at a first end of the slit and to a second size W2 at the other end. This embodiment is useful when there is a non-uniform intensity distribution of the optical radiation in the elongating direction of the slit and the elimination of such a non-uniform optical intensity is desirable. More particularly, the width W1 is set larger than the width W2 when the intensity of the optical radiation is smaller at the first end of the slit than at the second end. When the intensity distribution of the optical radiation is opposite, the width W2 is set larger than the width W1. Further, the change in the width of the slit 7a is not limited to be linear as illustrated in FIG. 5(E) but may be non-linear depending on the non-uniform pattern of the optical radiation.

Figure 5F:
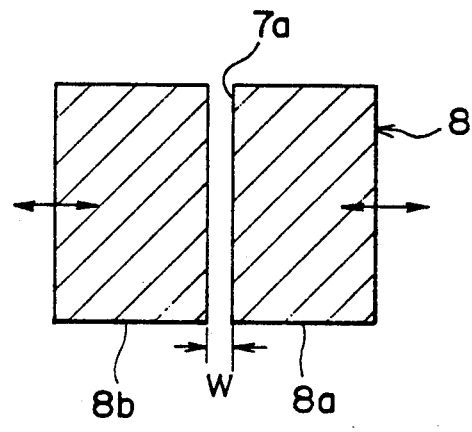

FIG. 5(F) shows an embodiment wherein the mask 7 is eliminated. In this embodiment, the slit 7a is formed by using the reticle blind 8 that is provided movable on the illuminating optical system 2. The reticle blind 8 is formed from two separate blades 8a and 8b that are moved parallel and simultaneously in the direction shown in the drawing by arrows. In this embodiment, it is possible to change the width W of the slit 7a as desired.

Figure 6:
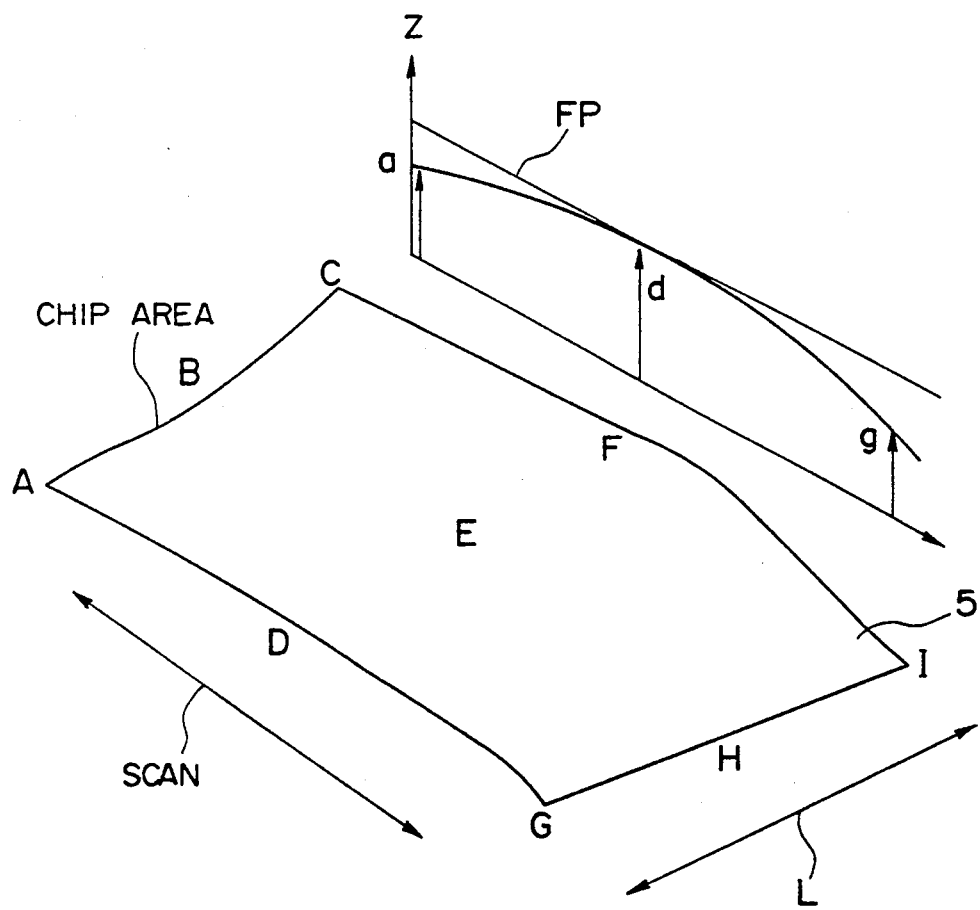
FIG. 6 is a diagram showing the exposure process according to a second embodiment of the present invention.

FIG. 6 is a diagram showing the exposure process according to a second embodiment of the present invention.

Referring to FIG. 6, there is a chip area shown as CHIP AREA on the surface of the wafer 5, wherein the chip area is defined by points A-I. It will be noted that the undulation on the surface of the chip area is not simple but a complex projection and depression exists. At the upper right of the illustration of the chip surface of the wafer 5, a cross section showing the undulation of the chip surface along the line connecting the points A, D and G is shown together with the focal plane on which the image of the reticle pattern is focused. As long as the surface undulation is a simple projection as shown in the cross section, one can maintain the close focusing of the reticle image by the exposure process of the first embodiment.

FIGS. 7(A)-7(C) are diagrams showing the surface undulation of the wafer 5 of FIG. 6 for various cross sections, wherein FIG. 7(A) shows a simple depression. In this case, too, the close focusing can be maintained by the exposure process of the first embodiment wherein the position of the wafer 5 is controlled in the Z-direction.

On the other hand, FIG. 7(B) shows a case wherein there is a generally planar slope exists on the surface of the wafer 5 along the cross section connecting the points D, E and F. In the present embodiment, the tilt of the wafer 5 is adjusted by controlling the stage 10 such that the surface of the wafer 5 becomes substantially perpendicular to the Z-direction that is coincident to the direction of the optical axis. Further, the height is controlled such that the surface coincides with the focal plate FP.

FIG. 7(C) shows a case wherein there is a gradient with gentle projection on the surface of the wafer 5. In this case, the wafer 5 is tilted such that the gradient is eliminated with respect to the focal plane FP, and the level of the wafer 5 in the direction of the optical axis is adjusted similar to the first. Thereby, the desired close focusing is maintained for the entire chip area. As the mechanism of the stage 10 for effecting such a tilting of the wafer 5 is known, further description will be omitted. About the tilting mechanism of the stage 10, reference should be made to Suwa et al., SPIE optical/laser microlithography, vol. 922, pp. 270–276, Santa Clara, U.S.A., March 1988.

FIGS. 8(A)-8(D) are diagrams showing the process for measuring the surface undulation or gradient of the wafer 5 prior to the exposure process of the first or second embodiment. The drawing shows the plan view of the semiconductor wafer 5 for one chip area together with the points of which level in the Z-direction is measured by the focusing detector 13 shown in FIG. 2. In this measurement process, optical radiation having a wavelength that is different from the wavelength of the optical radiation for the exposure is employed. For example, when a wavelength of 436 nm is used for the exposure, a wavelength of about 800 nm is used for the measurement. Such a measurement is achieved by the known auto-focusing mechanism and the description will be omitted.

Figure 8A:
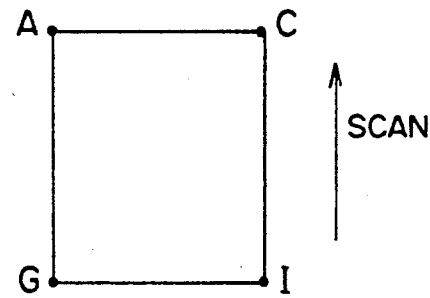
FIGS. 8(A)–8(D) are diagrams showing processes for detecting the surface morphology in the structure of FIG. 6 for carrying out the exposure process of the present invention.
Figure 8B:
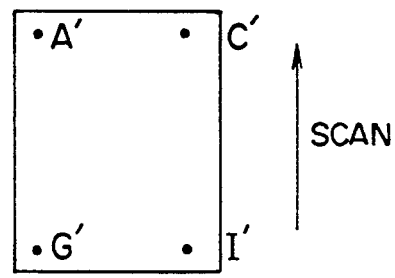

In the example of FIG. 8(A), the measurement of the level of the wafer surface is achieved at the four corner points A, C, G and I of the chip area, wherein these points are selected to be located on the scribe line (not shown) of the wafer 5. It should be noted that the scribe line defines the chip area. The detection is made by using a single optical beam for the level measurement while moving the wafer 5 together with the stage 10. In this measurement, the gradient of the wafer 5 is detected, assuming a planar wafer surface. In the example of FIG. 8(B), the measurement is conducted for points A', C', G' and I' that are located inside the scribe line of the chip area. In this case, too, the gradient of the wafer surface is detected and the compensation for the tilt is achieved by controlling the stage 10.

Figure 8C:
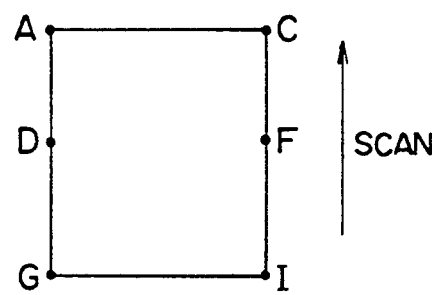

FIG. 8(C) shows an example for detecting the level of the wafer surface at the points A, C, D, F, G and I that are located on the scribe line. In this example, not only the gradient of the wafer 5 but also the undulation such as projection or depression of the wafer surface is detected.

Figure 8D:
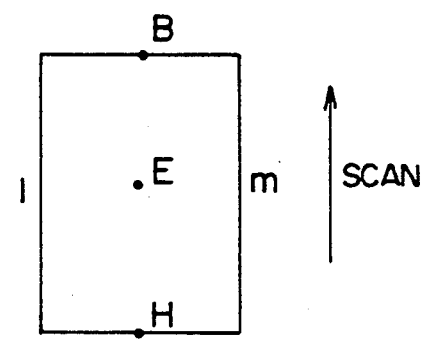

Further, FIG. 8(D) shows an example for detecting the level of the wafer surface at the points B, E and H. In this example, the surface undulation in the scanning direction alone is detected. On the other hand, the gradient in the direction along the line i-m shown in the drawing is not detected.

As already mentioned, the data thus obtained for the level of the wafer surface is stored in the memory 12 via the controller 11. Based upon the data thus stored in the memory 12, the controller 11 calculates the level and the tilt angle of the stage 10 that provide the proper focusing for each scanning position of the elongated optical beam on the wafer surface by interpolation. Further, the controller 11 controls the stage 10 as shown in FIGS. 7(A)-7(C) such that the desired close focusing of the optical beam is maintained on the surface of the wafer 5.

Figure 9A:
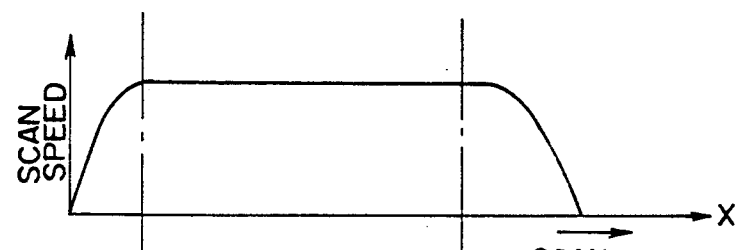
FIGS. 9(A)–9(C) are diagrams showing the scanning of the reticle and the adjustment of wafer height and tilt caused in response to the scanning.
Figure 9B:

In the foregoing first and second embodiments, the controller 11 controls the mask plate 7 and the stage 10 such that the movement is made continuously and in synchronization. For example, the mask plate 7 is moved in the scanning direction shown in FIGS. 5(A)-5(F) at a constant speed as shown in FIG. 9(A) while the stage 10 is moved up and down as shown in FIG. 9(B) with the broken line or tilted as shown in FIG.

Figure 9C:
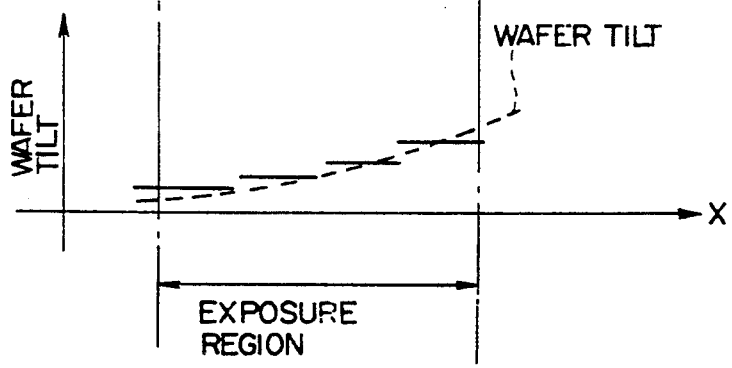

9(C) with the broken line. However, the movement of the stage 10 is not limited to such a continuous movement but may be made stepwise as shown by the continuous line in FIGS. 9(B) and 9(C).

Figure 10A:
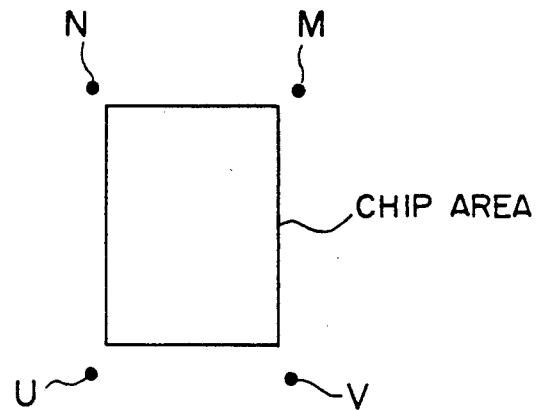
FIGS. 10(A)–10(C) are diagrams showing the other processes for detecting the surface morphology in the structure of FIG. 6.
Figure 10B:
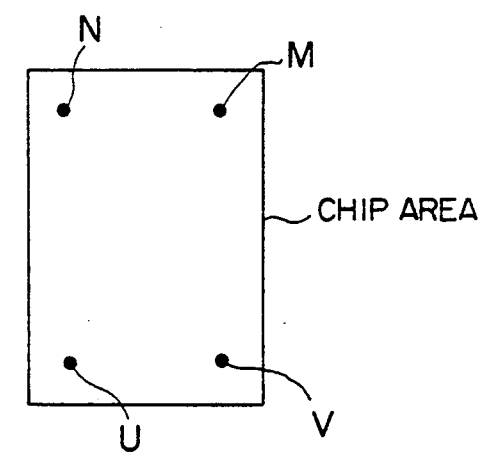
Figure 10C:
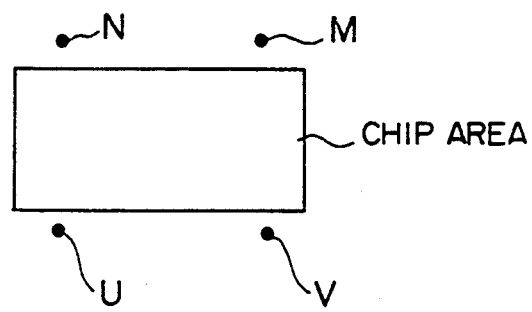

FIGS. 10(A)–10(C) show the level detection that is achieved by using a four-position level detector that has been used in the conventional auto-focusing system. In the four-position level detector, the level of four predetermined points N, M, U and V at four corners of the chip area is detected simultaneously. The detection and exposure are achieved similar to process explained with reference to FIGS. 8(A)–8(D). By detecting the level simultaneously for the points N–V, the time needed for the exposure can be reduced. Such a detection of the level may be achieved for example by the detector that employs four optical beams or that employs electrostatic sensors.

FIG. 11(A) shows the relationship between the slit 7a on the mask plate 7, the reticle blind 8 and the chip pattern on the reticle 3. For the sake of simplicity, the mask plate 7 is not illustrated.

The reticle blind 8 is formed from four movable blades 8a–8d, wherein the blades 8a and 8b are the blades that have been used in the embodiment of FIG. 5(F) for forming the slit 7a. The blades 8a–8d define an opening 8X at the central part of the reticle blind 8 of which size is changed as desired. Typically, the blades 8a–8d are set such that the front edge of the blade defining the opening 8X is located on an opaque frame area 3B of the reticle 3. The opaque frame area 3B is typically made of an opaque material such as chromium and defines a region 3A of the reticle 3 on which the device pattern for one chip is provided. See FIG. 11(B).

Figure 12:
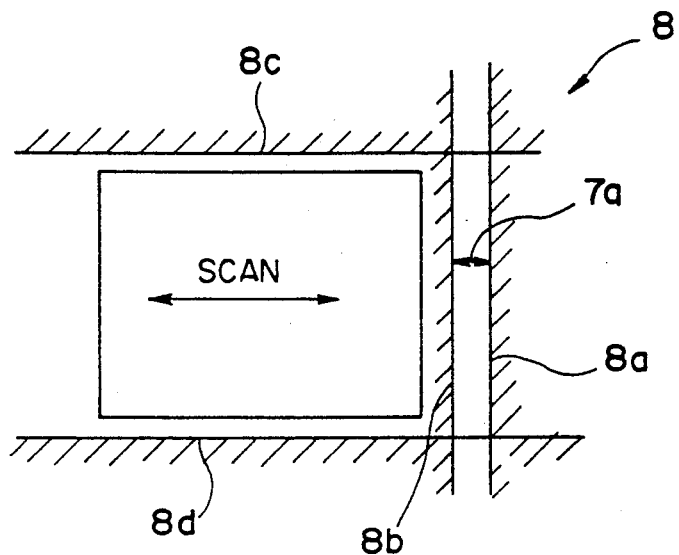
FIG. 12 is a diagram showing the formation of beam shaping slit by the reticle blind.

FIG. 12 shows the case corresponding to FIG. 5(F) wherein the movement of the blades 8a–8d of the reticle blind 8 is controlled such that the slit 7a is formed between the blade 8a and the blade 8b. In operation, the blades 8a and 8b are moved parallel in the scanning direction during the exposure. As already noted, the embodiment of FIG. 12 eliminates the need of additional mask plate 7 and the conventional optical exposure system can be used without modifying the hardware. It should be noted that the conventional system includes the mechanism for moving the blades of the reticle blind 8 that is achieved under the control of the controller 11. On the other hand, in order to implement the exposure process shown in FIG. 12, one has to form the width of the opaque band of the frame area somewhat larger than the width W of the slit 7a to avoid unwanted exposure.

Figure 13:
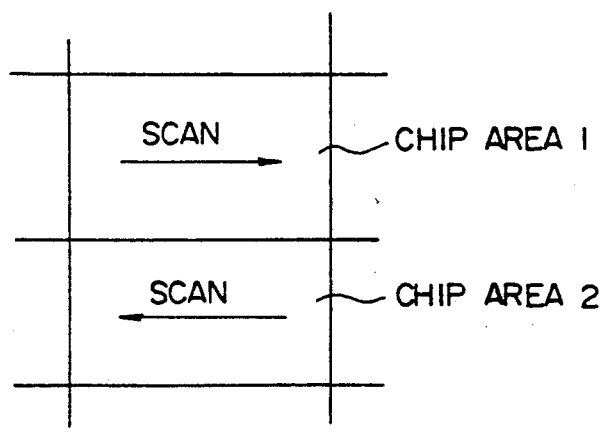
FIG. 13 is a diagram showing an example of scanning on the substrate by the shaped optical beam for various chips.

FIG. 13 shows an example of the scanning of the chip area by the elongated optical beam, wherein the direction of the scanning is inverted in each chip area such as CHIP AREA 1 and CHIP AREA 2. This scanning process is applicable to any of the foregoing embodiments. By scanning the optical beam alternately, one can eliminate the waste time for returning the mask plate 7 or reticle blades 8a and 8b to the initial position for each chip area. Associated therewith, one can reduce the wear of the mechanical part for moving the mask plate 7 or the blades 8a and 8b.

Figure 14A:
FIGS. 14(A) and 14(B) are diagrams showing various examples of scanning of the substrate.

FIG. 14(A) shows the scanning of the chip area by the elongated optical beam for a plurality of times, wherein the scanning is achieved in the same direction. This example corresponds to the case where the mask plate 7 shown in FIG. 5(D) is used. As already noted, the scanning that is made for a plurality of times is advantageous for reducing the unwanted temperature rise of the photoresist covering the surface of the wafer 5.

Figure 14B:
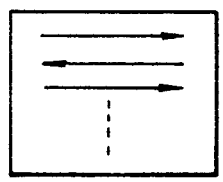

FIG. 14(B), on the other hand, shows the scanning of the chip area for a plurality of times wherein the direction of the scan is inverted each time. In this example, one can reduce the time needed for exposure as will be easily noted.

FIG. 15 shows a schematic flowchart representing the exposure operation achieved by the present invention.

Referring to FIG. 15, the step 101 corresponds to the level detection shown in FIGS. 8(A)–8(D) or FIGS. 10(A)–10(C), wherein the level of the wafer surface in the Z-direction is detected for the sampling points A–I or M–V by the known automatic focusing mechanism. The data of the level thus obtained is stored in the memory 12 shown in FIG. 2.

In the step 102, the level of the wafer surface other than the foregoing sampling points is calculated by the interpolation, and the mask plate 7 is moved in the step 103 along the scanning direction. Further, the optical source 1 is activated shortly before the step 103 is started. In the foregoing scanning process, the stage 10 is held stationary in the X- and Y-directions. Thereby, the control of the exposure is achieved without complexity.

While moving the mask plate 7 in the step 103, the height of the stage 10 in the Z-direction as well as the tilt of the stage 10 are adjusted in the step 104, and the steps 103 and 104 are repeated until the exposure is completed. Thereby, the surface of the reticle is scanned by the elongated optical beam and the surface of the wafer 5 is scanned also by the elongated optical beam that is patterned according to the chip pattern on the reticle 3.

Further, the present invention is not limited to the embodiments described heretofore, but various variations and modifications may be made without departing from the scope of the invention.

What is claimed is:

1. A method for exposing a surface of an object to a radiation beam for writing a pattern thereon, comprising the steps of:

producing radiation;

shaping the radiation to form a shaped radiation beam such that the shaped radiation beam has an elongated cross section extending in a first direction by passing the radiation through a mask that has an elongated opening corresponding to said elongated cross section of said shaped beam and elongating in said first direction;

directing the shaped radiation beam, along an optical axis, to a reticle that carries a transparent pattern and an opaque pattern for patterning the shaped radiation beam to form a patterned beam in accordance with said transparent and opaque patterns on the reticle upon passage of the radiation through the reticle and for exposing the surface of the object by said patterned beam that travels along said optical axis, said step of directing the patterned beam including a step for scanning the patterned beam in a second, different direction over a surface of said reticle by moving the mask in said second direction; and maintaining a focusing of the patterned beam on the surface of the object by moving said object.

2. A method as claimed in claim 1 in which said step of maintaining the focusing of the patterned beam includes a step of moving the object in a direction of the optical axis.

3. A method as claimed in claim 2 in which said step of maintaining the focusing of the patterned beam further includes a step of tilting the object such that the surface of the object becomes substantially perpendicular to the optical axis.

4. A method as claimed in claim 1 in which said step of shaping the radiation forms the shaped radiation beam to have a rectangular cross section elongating in said first direction.

5. A method as claimed in claim 1 in which said first direction and said second direction intersect with each other substantially at a right angle.

6. A method as claimed in claim 1 in which said first direction and said second direction intersect with each other obliquely.

7. A method as claimed in claim 1 in which said step of shaping the radiation forms the shaped radiation beam to have first and second widths, measured in said second direction, such that the first width is different from the second width.

8. A method as claimed in claim 1 in which said step of illuminating the surface of the reticle by the shaped radiation beam is achieved for a plurality of times.

9. A method as claimed in claim 1 in which said mask has at least one additional elongated opening corresponding to said elongated cross section of said shaped beam and elongating in said first direction.

10. A method as claimed in claim 1 in which said step of shaping the radiation comprises a step of controlling a reticle blind that is used in an optical exposure system for defining a region of the reticle surface that is to be illuminated by the radiation such that an elongated opening is formed between a pair of opposing opaque blades that form the reticle blind in correspondence to the elongated cross section of the shaped beam.

11. A method as claimed in claim 1 in which said step of moving the mask is achieved by moving the mask continuously.

12. A method as claimed in claim 1 in which said step of moving the mask is achieved by moving the mask stepwise.

13. A method for exposing a surface of an object to a radiation beam for writing a pattern thereon, comprising the steps of:
producing radiation;
shaping the radiation to form a shaped radiation beam such that the shaped radiation beam has an elongated cross section extending in a first direction;
directing the shaped radiation beam, along an optical axis, to a reticle that carries a transparent pattern and an opaque pattern for patterning the shaped radiation beam to form a patterned beam in accordance with said transparent and opaque patterns on the reticle upon passage of the radiation through the reticle and for exposing the surface of the object by said patterned beam that travels along said optical axis, said step of directing the patterned beam including a step for scanning the patterned beam in a second, different direction over a surface of said reticle;
maintaining a focusing of the patterned beam on the surface of the object by moving said object; and
detecting a level of the surface of the object for each location of the surface of the object, and storing data indicative of the level of the surface of the object in a memory, said step of maintaining the focusing of the patterned beam being achieved by moving the object such that a deviation in the level of the surface of the object from a level wherein a proper focusing is achieved, is compensated.

14. A method as claimed in claim 13 in which said object is moved by a controller in response to the data read from the memory.

15. A method for exposing a surface of an object to a radiation beam for writing a pattern thereon, comprising the steps of:
producing radiation;
shaping the radiation to form a shaped radiation beam such that the shaped radiation beam has an elongated cross section extending in a first direction;
directing the shaped radiation beam, along an optical axis, to a reticle that carries a transparent pattern and an opaque pattern for patterning the shaped radiation beam to form a patterned beam in accordance with said transparent and opaque patterns on the reticle upon passage of the radiation through the reticle and for exposing the surface of the object by said patterned beam that travels along said optical axis, said step of directing the patterned beam including a step for scanning the patterned beam in a second, different direction over a surface of said reticle; and
maintaining a focusing of the patterned beam on the surface of the object by moving said object;
in which said step of shaping the radiation employs a mask that carries a slit for shaping the radiation and for producing the shaped radiation beam at a position on the optical axis that is optically conjugate to the surface of the object.

* * * * *